US006983895B2

(12) United States Patent
Augustin et al.

(10) Patent No.: US 6,983,895 B2
(45) Date of Patent: Jan. 10, 2006

(54) PIEZOELECTRIC ACTUATOR WITH COMPENSATOR

(75) Inventors: Ulrich Augustin, Blythewood, SC (US); Wendelin Klügl, Seubersdorf (DE)

(73) Assignees: Siemens Aktiengesellschaft, Munich (DE); DST Siemens Diesel Systems Technology LLC, Blythewood, SC (US)

( * ) Notice: Subject to any disclaimer, the term of this patent is extended or adjusted under 35 U.S.C. 154(b) by 24 days.

(21) Appl. No.: 10/682,042

(22) Filed: Oct. 9, 2003

(65) Prior Publication Data

US 2005/0077379 A1   Apr. 14, 2005

(51) Int. Cl.
   *B05B 1/08*   (2006.01)
   *B05B 3/04*   (2006.01)

(52) U.S. Cl. .............................. 239/102.2; 239/102.1; 239/585.1; 239/533.7; 239/533.8; 239/533.9; 239/533.11

(58) Field of Classification Search ............. 239/102.2, 239/533.7, 533.8, 533.9, 533.11, 585.1–585.05, 239/129.06; 251/129.06
See application file for complete search history.

(56) References Cited

U.S. PATENT DOCUMENTS

| 6,213,414 | B1 * | 4/2001 | Stier et al. ................... 239/584 |
| 6,400,066 | B1 * | 6/2002 | Sumrak et al. ............. 310/346 |
| 6,575,138 | B2 * | 6/2003 | Welch et al. ............... 123/467 |
| 6,585,171 | B1 * | 7/2003 | Boecking .................. 239/102.1 |
| 6,650,032 | B2 * | 11/2003 | Sumrak et al. ............. 310/346 |
| 6,676,035 | B2 * | 1/2004 | Lorraine et al. .......... 239/102.2 |
| 6,749,127 | B2 * | 6/2004 | Lorraine et al. ............... 239/5 |
| 6,755,353 | B2 * | 6/2004 | Lorraine et al. ......... 239/102.2 |
| 6,766,965 | B2 * | 7/2004 | D'Arrigo ................. 239/102.2 |
| 6,776,354 | B2 * | 8/2004 | Cooke ..................... 239/102.2 |
| 6,843,464 | B2 * | 1/2005 | Stoecklein et al. ........... 251/57 |

* cited by examiner

*Primary Examiner*—David A. Scherbel
*Assistant Examiner*—James S. Hogan
(74) *Attorney, Agent, or Firm*—Baker Botts L.L.P.

(57) ABSTRACT

A temperature compensated actuator device comprises a piezoelectric stack having first and second ends along a central axis and having a first thermal expansion coefficient; and a compensator arranged on one end of the piezoelectric stack. The compensator comprises a first member in form of a cylinder; a second member in form of a piston plate wherein the first member and the second member are arranged movably along the axis with respect to each other and define a hollow space between them; and a compensation member having a thermal expansion coefficient higher than the first thermal expansion coefficient for filling the hollow space.

32 Claims, 4 Drawing Sheets

PIEZOELECTRIC ACTUATOR WITH COMPENSATOR

BACKGROUND OF THE INVENTION

The invention relates to a piezoelectric actuators and their application within fuel injector valves. Such a piezoelectric actuator may be to actuate a control valve such as a servovalve within fuel injection valve for controlling flow of a medium. These kind of valves can be used for the direct control of an injection needle within an fuel injection valve or indirect control of a needle by means of a control valve. These kind of valves usually comprise a housing having an inlet duct and an outlet duct and, a movable body which can reciprocate in order to control communication between the inlet and the outlet ducts, and drive means for the reciprocating movement of the body.

A known valve of this kind includes a piezoelectric actuating member supported in a valve housing, the housing having an inlet duct and an outlet duct and a movable body which can be displaced by the actuating member in order to control in operation a flow of pressurized fluid through a connection between the inlet and outlet ducts, the surfaces of the movable body on which pressurized fluid can produced hydrostatic force being arranged to minimize any resulting hydrostatic force in a direction tending to oppose movement of the actuating member.

The possible extension of the piezoelectric element of such a valve and thus the potential stroke of the valve is usually small, for example, of the order to 10 or 20 micrometers. It is therefore essential to minimize the effect of thermal expansion on the valve parts so that the flow through the valve will vary only slightly with changes of ambient temperature. One solution to the problem is to choose a material for the valve housing which material has a similar thermal expansion coefficient to that of the piezoelectric element. An example of such a material is a nickel-iron alloy having a low coefficient of thermal expansion. A possible disadvantage to the use of this material is the high cost of the alloy.

U.S. Pat. No. 4,284,263 discloses a control valve having an actuating member supported within and between a closed end and a seat end of a housing, the actuating member has a fixed end connected to the close housing end and a free end connected to a movable valve body. The actuating member includes an elongated piezoelectric element which has a relatively low thermal coefficient of expansion. The housing is made from common, inexpensive materials having moderately higher thermal coefficient of expansion, and the actuating member includes a spacer having a high thermal coefficient of expansion, arranged between the closed housing end and the piezoelectric element. By proper dimensioning of the spacer and housing with respect to the piezoelectric element, temperature compensation may be achieved without the use of exotic materials. However, as shown in FIG. 2 of U.S. Pat. No. 4,284,263, the compensating structure elongates the device significantly.

SUMMARY OF THE INVENTION

It is, therefore, the object of the invention to provide an alternative construction for a control valve which can enable the effects of thermal expansion to be reduced allowing a compact design of the device while maintaining low production costs.

A temperature compensated actuator device may comprise, for example, a piezoelectric stack having first and second ends along a central axis and having a first thermal expansion coefficient; and a compensator arranged on one end of the piezoelectric stack. The compensator may comprise a first member in form of a cylinder; a second member in form of a piston plate wherein the first member and the second member are arranged movably along the axis with respect to each other and define a hollow space between them; and a compensation member having a thermal expansion coefficient higher that the first thermal expansion coefficient for filling the hollow space.

A fuel injector valve may comprise a body having an inner cavity for receiving a piezoelectric actuator, wherein the cavity comprises an opening which forms a control valve by means of a valve member which can be actuated by the piezoelectric actuator, wherein the piezoelectric actuator device comprises a piezoelectric stack having first and second ends along a central axis and having a first thermal expansion coefficient; and a compensator arranged on one end of the piezoelectric stack. The compensator may comprise a first member in form of a cylinder; a second member in form of a piston plate wherein the first member and the second member are arranged movably along the axis with respect to each other and define a hollow space between them; and a compensation member having a thermal expansion coefficient higher that the first thermal expansion coefficient for filling the hollow space.

The actuator device may further comprise a top plate and a bottom plate in between which the piezoelectric stack and the compensator are arranged. The top plate may comprise at least one opening through which the piezoelectric stack can be electrically contacted. The piezoelectric stack may comprise a plurality of piezoelectric elements. The first member can be a cup shaped cylinder having an opening and the second member can be a plate having an elevated section which fits within the opening. The actuator device may further comprise a tube spring coupling the top and bottom plate for preloading the compensator. The tube spring can be made of metal and may have a thermal coefficient of about $11,5 \times 10^{-6}/K$. The first member may comprise an inner cavity and an opening, wherein a piston plate of the second member is movably arranged within the cavity through the opening to define the hollow space. The actuator device may further comprise a spring arranged within the cavity between the piston plate and the opening. The first member may comprise two parts which can be coupled via a connecting thread. The second member may comprise two parts which can be coupled via a connecting thread. The compensation member can be made of plastic having a high thermal expansion coefficient, such as, about $100 \times 10^{-6}/K$. The first and second member can be made of metal having a thermal coefficient of about $11,5 \times 10^{-6}/K$.

One advantage of such a compensator for a piezoelectric actuator is that it can be designed as a very compact unit because the compensation member is substantially prevented from expanding in a radial direction by a respective housing. This suppression of radial expansion causes an even stronger expansion in an axial direction.

BRIEF DESCRIPTION OF THE DRAWINGS

By way of example, a particular embodiment of the invention will now be described with reference to the accompanying drawings, in which.

DETAILED DESCRIPTION OF THE PREFERRED EMBODIMENTS

Figure 1:
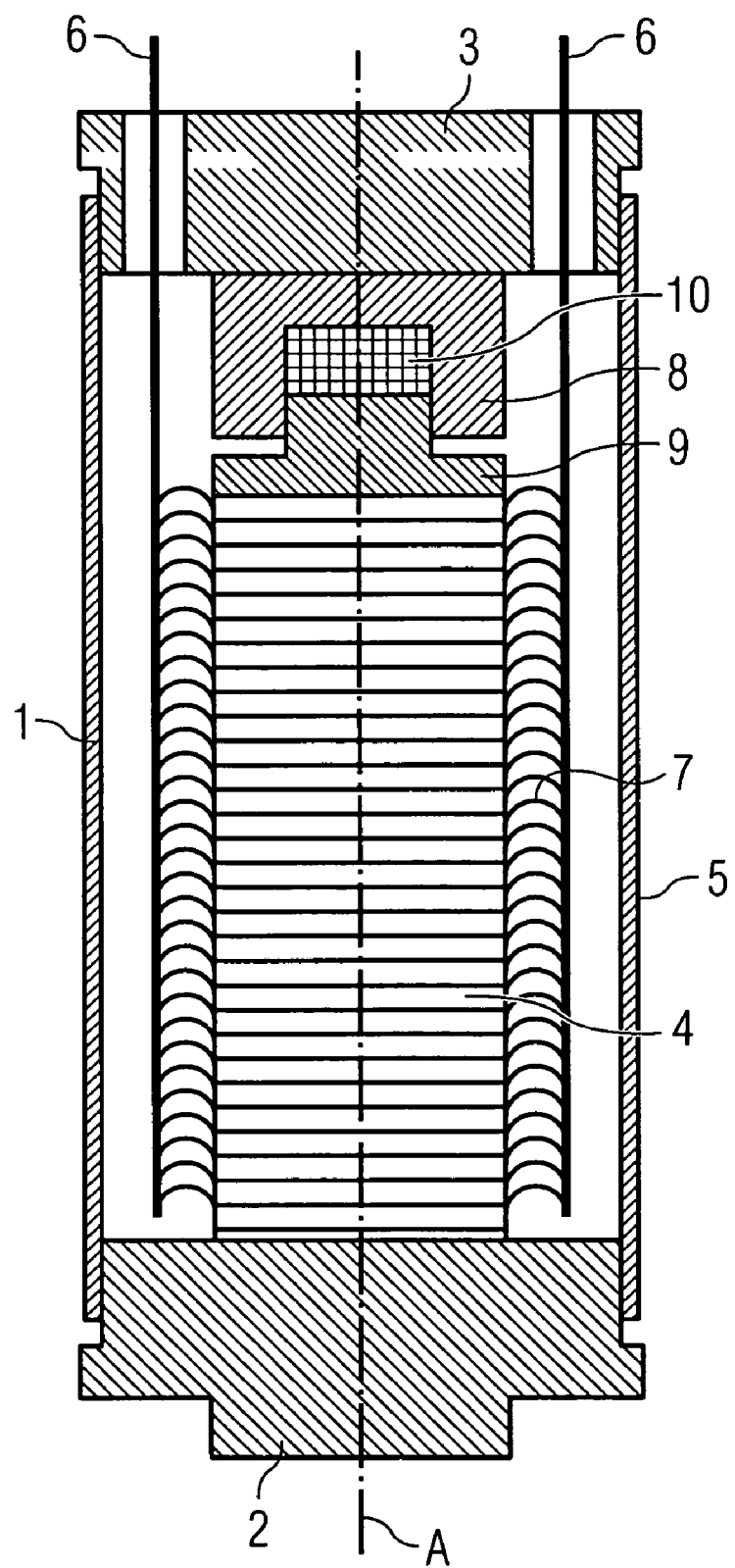
FIG. 1 shows a cross sectional view of a piezoelectric actuator according to the present invention.

FIG. 1 shows a sectional view of piezoelectric actuator for use in, for example, a fuel injection valve. Axis A indicates the expansion axis along which the piezoelectric actuator expands to engage with, for example, a control valve member for opening or closing a valve (not shown). The actuator comprises a bottom end plate 2 and top end plate 3 between which a piezoelectric stack 4 is arranged. Top and bottom end plates 3 and 2 can be made from metal such as normal steel or any other suitable material. The piezoelectric stack consists of a plurality of piezoelectric elements and thus comprises a plurality of connecting wires 7 which are combined to two single wires 6 which are led through respective openings in the top end plate 3. The piezoelectric stack may have an exemplary expansion coefficient of $2 \times 10^{-6}$/K. On top of the piezoelectric stack between the top end plate 3 and the bottom plate 2 is a compensator device arranged in a suitable way to compensate thermal induced length changes of the piezoelectric stack 4 as will be explained in more detail below.

This compensator comprises a sandwich arrangement of a piston plate 9, a compensator cylinder 10 and a cylinder 8. The piston plate 9 comprises an elevated piston section on top of which the compensator cylinder 10 is arranged. Cylinder 8 is shaped like a cup and completely covers the compensator cylinder 10 and parts of the elevated piston in such a way that the assembly of the three elements is able to expand along the expansion axis of the piezoelectric stack 4. Cylinder 8 and piston plate 9 are manufactured from a suitable metal, preferably form the same material as the housing of the injector valve. For example normal steel can be used for these parts. The expansion of the compensator is basically controlled and thus dominated by the compensator cylinder 10. The bottom end plate 2 and the top end plate 3 are coupled and preloaded by a tube spring 1 connecting the top and bottom plate 3 and 2.

Figure 2:
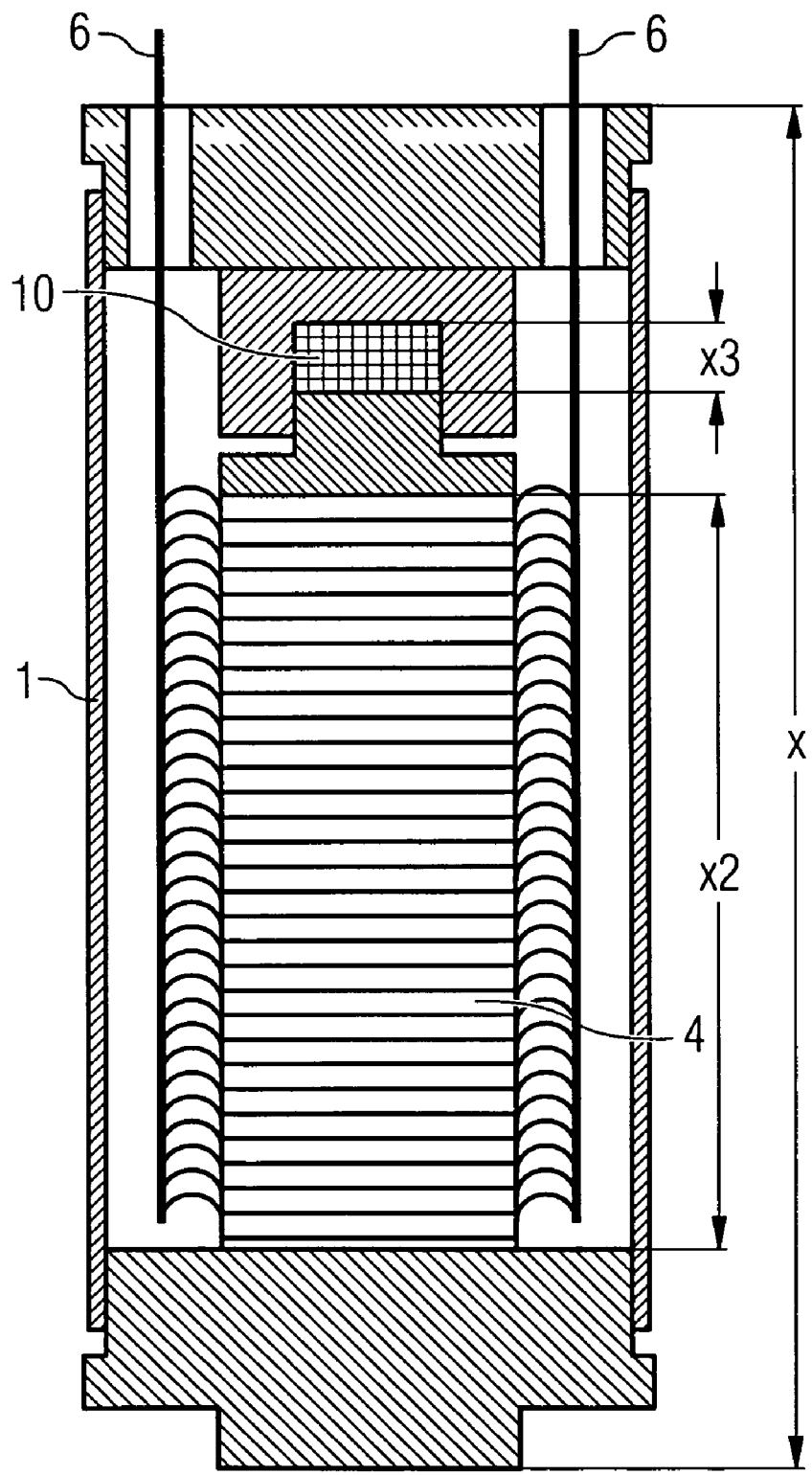
FIG. 2 shows exemplary dimensions of the piezoelectric actuator as shown in FIG. 1, FIGS. 3 and 4 show the compensator in a biased and non-biased state.

FIG. 2 shows the same piezoelectric actuator including particular designated expansion areas. The overall length of the actuator is designated by x1 and will expand to the same extent as a not shown housing of the injection valve. The length of the piezoelectric stack is designated as x2 and comprises a relatively small thermal expansion when compared to the expansion of the housing of the injection valve. This small expansion is compensated by the relatively large expansion of the compensator whose length is designated by x3.

Figure 3:
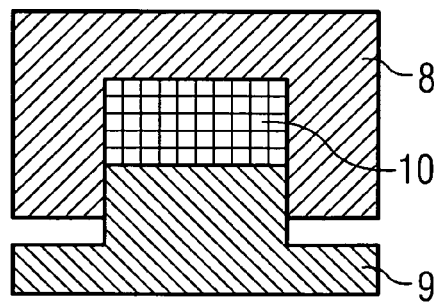
Figure 4:
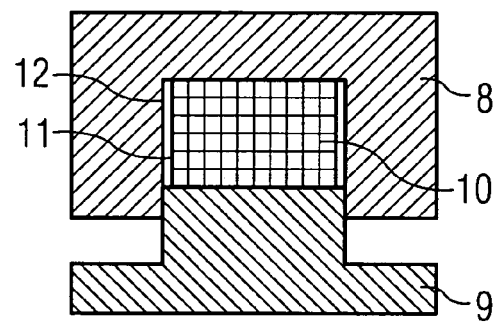

FIG. 3 shows the compensator when assembled within the piezoelectric actuator. Without the compensator cylinder 10 inserted, cylinder 8 can move along the expansion axis A of the piezoelectric actuator 4 with respect to the piston plate 9 wherein the elevated piston of the piston plate 9 extends into the opening of the cup shaped cylinder 8. The opening of cavity defined by piston plate 9 and cylinder 8 is however filled with the solid compensation cylinder 10. This compensation cylinder 10 can be preferably made of a plastic with a high expansion coefficient. Due to the preload of the tube spring 1, the plastic cylinder 10 completely fills out the cavity defined by the cylinder 8 and piston plate 9. FIG. 4 shows the compensator without the preload of the tube spring 1. The size of the plastic cylinder 10 is chosen in such a way that the gap defined between the side wall 11 of the plastic cylinder 10 and the inner side wall 12 of the cylinder 8 disappears when the preload of the tube spring compresses the sandwich arrangement. Thus, when the preload of the tube spring is engaged, the whole sandwich arrangement becomes stiff or rigid. The deformation of the plastic cylinder 10 is, thus, supposed to take place within an elastic range.

In case of an increase in temperature, the plastic cylinder will expand at a rate of approximately $100 \cdot 10^{-6}$/K. However, other appropriate materials for the compensation cylinder can be used as long the thermal expansion coefficient is high enough to allow for a reasonable size of the compensator. The metallic cylinder 8 prevents almost all radial expansion of the plastic cylinder 10. Thus, the expansion in axial direction will be multiplied by a factor of 3. In a first approximation, the plastic cylinder must therefore have a length which is defined by the following equation:

$$x1 - (x3 + x2) \times 11.5 \times \frac{10^{-6}}{K} + x2 \times 2 \times \frac{10^{-6}}{K} + x3 \times 300 \times \frac{10^{-6}}{K} =$$

$$x1 \times 11.5 \times \frac{10^{-6}}{K} x3 = \frac{9.5}{288.5} x2 \approx \frac{1}{30} x2$$

Thus, depending on the expansion factor of the plastic cylinder, its length x3 need only be approximately up to 1/30 of the length x2 of the piezoelectric stack 4. However, using different materials for the compensation cylinder 10, different ratios may be achieved. Thus, a much more compact design of an actuator and, therefore, a fuel injection valve is possible while cost efficient materials can be used.

Figure 5:
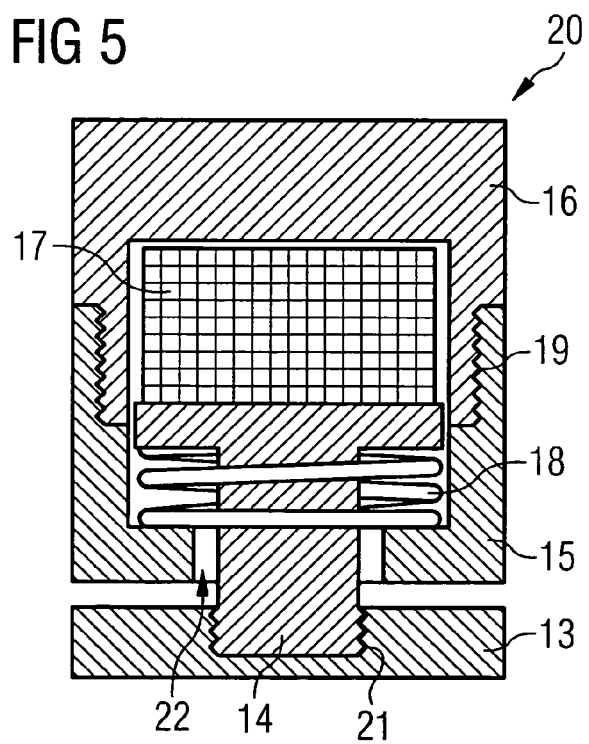
FIG. 5 shows another embodiment of the compensator device.

FIG. 5 shows a second embodiment of a compensator 20. This type of compensator comprises a "built-in preload" function. Thus, the actuator does not need a tube spring to preload the compensator. The compensator 20 comprises only a few parts which allow an easy assembly. The compensator body is formed by two parts 15 and 16. The top cover 16 has the shape of a cup and comprises an outside thread on the lower part of the side wall. The bottom cup 15 comprises an opening 22 in its bottom plate the inside of the upper wall is provided with an inner thread which engages with the outer thread 19 of the top cover 16. When the bottom cup 15 is screwed on the top cover, both parts form a can with an opening in the bottom plate. A stamp plate 14 can be arranged in the inside of this can assembly. The stamp plate 14 comprises an extension cylinder which extends outside the can assembly. The end of the extension cylinder may comprise another outside thread 21. A connection plate 13 comprises a blind hole with an inner thread. Thus, the connection plate can be screwed on the stamp plate 14. However, elements 13 and 14 can also be manufactured in a single piece if the design allows positioning of the piston plate 14 within the compensator body 15 and 16. Inside the compensator 20, the same plastic cylinder 17 is provided between the top cover and the stamp plate 14. For providing a preload, a spring 18 is arranged between the stamp plate 14 and the bottom cup 15. Thus, a very compact compensator is provided without the need of a tube spring to preload the piezoelectric stack—compensator assembly because the compensator 20 has an integrated preload function.

A variety of other embodiment within the same concept is possible. For example, the compensator body might be manufactured from a single part having an opening that allows insertion of the respective elements 14, 17, and 18. Snap in technology can be used instead of threads and different embodiments of the spring 18 can be used to generate the preload. For example, the bottom part 15 may have an integrated spring element.

The compensator 20 as shown in FIG. 5 can be assembled as follows: The spring is inserted into the bottom cup 15. Then, the piston plate is inserted whereby the extension comprising the thread 21 reaches and extends through the opening 22. Next, the connection plate 13 is screwed onto this extension. Finally, the plastic cylinder is placed on top of the piston plate 14 and the top cover is screwed onto the bottom cup 15 to form a rigid compensator arrangement 20.

Figure 6:
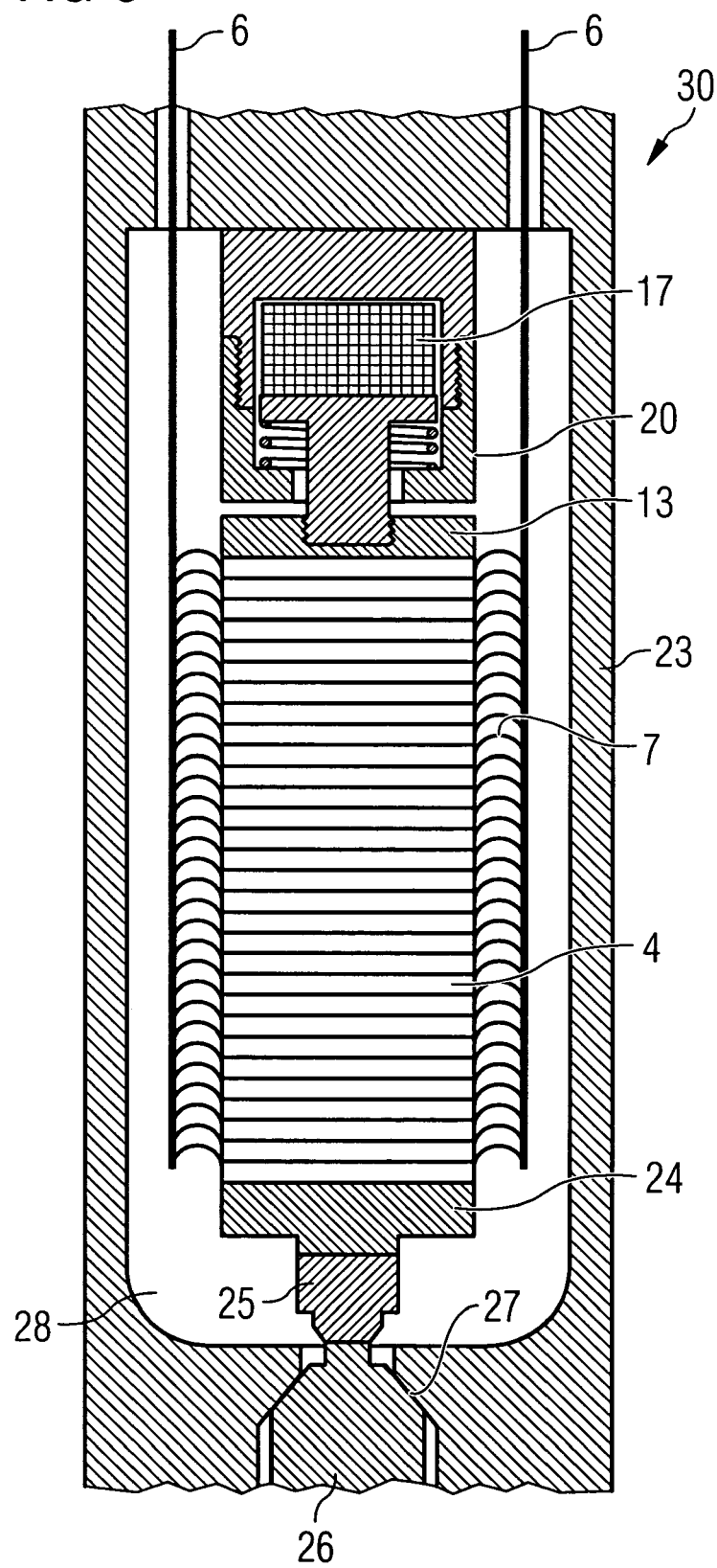
FIG. 6 shows a partial sectional view of a fuel injector valve using the actuator according to the second embodiment.

FIG. 6 shows a partial sectional view of an exemplary arrangement of a fuel injection valve using a compensated piezoelectric stack with a compensator as shown in FIG. 5. Like elements are designated with like numerals as used in the previous figures. The compensator 20 is fixedly mounted on top of the piezoelectric stack 4 by means of the mounting plate 13 which is coupled with the piston plate 14. An end plate 24 is provided on the other end of the piezoelectric stack 4 which connects to a actuator member 25 for engaging with the control member 26. Control member 26 is preloaded by a spring (not shown) to engage with the edge 27 to form a control valve. The control valve, thus, opens or closes a connection between a first chamber 28 and a second chamber formed below the control member 26 (not shown). Respective inlets and outlets (not shown) for these chambers are used to control the pressure within the injection valve to open or close a respective injection valve (not shown). These mechanism are well known in the art and not further explained. The whole arrangement can be placed within a housing 23. The housing can be of an inexpensive material such as normal steel or any other suitable metal. The larger thermal expansion of this housing in relation to the smaller thermal expansion of the piezoelectric stack will be compensated by the large expansion of the plastic cylinder 17 within the compensator 20 as explained above. Thus, a compact design of a fuel injector is possible which at the same time can be manufactured in an inexpensive manner.

We claim:

1. A temperature compensated actuator device comprising:
    a piezoelectric stack having first and second ends along a central axis and having a first thermal expansion coefficient;
    a compensator arranged on one end of the piezoelectric stack comprising:
        a cylinder;
        a piston plate, said cylinder and the piston plate arranged movably along said axis with respect to each other and define a hollow space between them; and
        a compensation member for filling said hollow space, said member having a thermal expansion coefficient higher than the first thermal expansion coefficient of the piezoelectric stack.

2. The actuator device as in claim 1, further comprising a top plate and a bottom plate in between which said piezoelectric stack and said compensator are arranged.

3. The actuator device as in claim 2, wherein said top plate comprises at least one opening through which said piezoelectric stack can be electrically contacted.

4. The actuator device as in claim 1, wherein said piezoelectric stack comprises a plurality of piezoelectric elements.

5. The actuator device as in claim 1, wherein said cylinder is a cup shaped cylinder having an opening and said piston plate is a plate having an elevated section which fits within said opening.

6. The actuator device as in claim 2, further comprising a tube spring coupling said top and bottom plate for preloading said compensator.

7. The actuator device as in claim 6, wherein said tube spring is made of metal.

8. The actuator device as in claim 7, wherein the metal has a thermal coefficient of about $11{,}5\times10-6/K$.

9. The actuator device as in claim 1, wherein the cylinder comprises an inner cavity and an opening, wherein the piston plate is movably arranged within said cavity through said opening to define said hollow space.

10. The actuator device as in claim 9, further comprising a spring arranged within said cavity between said piston plate and said opening.

11. The actuator device as in claim 9, wherein the cylinder comprises two parts which can be coupled via a connecting thread.

12. The actuator device as in claim 9, wherein the piston plate comprises two parts which can be coupled via a connecting thread.

13. The actuator device as in claim 1, wherein the compensation member is made of plastic having a high thermal expansion coefficient.

14. The actuator device as in claim 13, wherein the thermal coefficient is about $100\times10-6/K$.

15. The actuator device as in claim 1, wherein the cylinder and piston plate are made of metal.

16. The actuator device as in claim 15, wherein the metal has a thermal coefficient of about $11{,}5\times10-6/K$.

17. A fuel injector valve comprising:
    a body having an inner cavity for receiving a piezoelectric actuator, the cavity comprises an opening which forms a control valve by means of a valve member which can be actuated by said piezoelectric actuator, wherein the piezoelectric actuator device comprises:
    a piezoelectric stack having first and second ends along a central axis and having a first thermal expansion coefficient;
    a compensator arranged on one end of the piezoelectric stack comprising:
        a cylinder;
        a piston plate, said cylinder and the piston plate arranged movably along said axis with respect to each other and define a hollow space between them; and
        a compensation member for filling said hollow space, said member having a thermal expansion coefficient higher than the first thermal expansion coefficient.

18. The fuel injector valve as in claim 17, further comprising a top plate and a bottom plate in between which said piezoelectric stack and said compensator are arranged.

19. The fuel injector valve as in claim 18, wherein said top plate comprises at least one opening through which said piezoelectric stack can be electrically contacted.

20. The fuel injector valve as in claim 17, wherein said piezoelectric stack comprises a plurality of piezoelectric elements.

21. The fuel injector valve as in claim 17, wherein said cylinder is a cup shaped cylinder having an opening and said piston plate is a plate having an elevated section which fits within said opening.

22. The fuel injector valve as in claim 18, further comprising a tube spring coupling said top and bottom plate for preloading said compensator.

23. The fuel injector valve as in claim 22, wherein said tube spring is made of metal.

24. The fuel injector valve as in claim 23, wherein the metal has a thermal coefficient of about $11,5 \times 10-6/K$.

25. The fuel injector valve as in claim 17, wherein the cylinder comprises an inner cavity and an opening, wherein the piston plate is movably arranged within said cavity through said opening to define said hollow space.

26. The fuel injector valve as in claim 25, further comprising a spring arranged within said cavity between said piston plate and said opening.

27. The fuel injector valve as in claim 25, wherein the cylinder comprises two parts which can be coupled via a connecting thread.

28. The fuel injector valve as in claim 25, wherein the piston plate comprises two parts which can be coupled via a connecting thread.

29. The fuel injector valve as in claim 17, wherein the compensation member is made of plastic having a high thermal expansion coefficient.

30. The fuel injector valve as in claim 29, wherein the thermal coefficient is about $100 \times 10-6/K$.

31. The fuel injector valve as in claim 17, wherein the cylinder and piston plate are made of metal.

32. The actuator device as in claim 31, wherein the metal has a thermal coefficient of about $11,5 \times 10-6/K$.

* * * * *